United States Patent [19]

Sikorski

[11] Patent Number: 5,018,938
[45] Date of Patent: May 28, 1991

[54] METHOD AND APPARATUS FOR SEPARATING CHIPS

[75] Inventor: Theodore J. Sikorski, Hamilton Square, N.J.

[73] Assignee: AT&T Bell Laboratories, Murray Hill, N.J.

[21] Appl. No.: 524,957

[22] Filed: May 18, 1990

[51] Int. Cl.[5] .......................................... B66C 23/00
[52] U.S. Cl. ............................. 414/786; 414/744.8; 125/13.01; 51/283 R
[58] Field of Search ................... 901/6, 16, 41, 40; 414/786, 744.1, 744.2, 744.3, 744.8; 51/283 R; 125/13.01, 16.01

[56] References Cited

U.S. PATENT DOCUMENTS

| | | | |
|---|---|---|---|
| 3,377,653 | 4/1968 | Buonaiuto | 18/5 |
| 3,893,644 | 7/1975 | Drazick | 249/68 |
| 4,253,280 | 3/1981 | Du Bois et al. | 125/13.01 |
| 4,407,262 | 10/1983 | Wirz et al. | 125/13.01 |
| 4,526,646 | 7/1985 | Suzuki et al. | 156/361 |
| 4,556,362 | 12/1985 | Bahnck et al. | 414/744 B |
| 4,852,304 | 8/1989 | Honda et al. | 125/13.01 |
| 4,944,119 | 7/1990 | Gill, Jr. et al. | 51/283 R |

OTHER PUBLICATIONS

Sales Literature, "Flexible Work Station," AT&T, Jan. 1989.

Primary Examiner—Joseph F. Peters, Jr.
Assistant Examiner—R. B. Johnson
Attorney, Agent, or Firm—R. B. Levy

[57] ABSTRACT

An apparatus (18) for separating an individual chip (14) from a semiconductor wafer (10) adhered to a diaphragm (16) comprises a "C"-shaped arm (26) having parallel, spaced-apart upper and lower arm portions (28) and (29). The upper arm portion (28) is provided with a yoke (34) at its free end for engaging a robot (42) which carries a pickup tool (46). The free end of the lower arm portion (29) mounts a die ejector (38) lying directly beneath the pickup tool (46) when the robot (42) engages the upper arm portion (28). Once the die ejector (38) is positioned below, and the pickup tool (46) is positioned above, a particular chip (14), actuation of the die ejector causes the chip to be separated and urged upwardly for engagement by the pickup tool. In this way, the need to separately position the die ejector (38) and the pickup tool (46) is obviated.

4 Claims, 1 Drawing Sheet

METHOD AND APPARATUS FOR SEPARATING CHIPS

TECHNICAL FIELD

This invention relates to a method and apparatus for separating chips from a semiconductor wafer to facilitate their pickup and subsequent placement by a pickup tool.

BACKGROUND OF THE INVENTION

Integrated circuits are typically manufactured from electronic circuits which are first formed on a semiconductor wafer. After the circuits are formed, the wafer is then diced into individual circuit-containing chips which, when packaged, form an integrated circuit. It is desirable during the manufacturing process to keep the chips arrayed to facilitate their testing. For this reason, once the circuits have been formed on the wafer, the wafer is set on an adhesive diaphragm. The wafer is then diced on the diaphragm such that the diaphragm remains intact, keeping the chips arrayed.

Separation of the chips from the diaphragm has been accomplished in the past by placing the diaphragm on a x-y table having a central opening seated within which is a die ejector. The x-y table displaces the diaphragm so that a selected chip overlies the die ejector. Actuating the die ejector pin serves to separate the chip from the diaphragm. A vacuum pickup tool, typically carried by a robot, is then positioned over the just-separated chip to engage it so the chip can be transported to a desired location. An example of a apparatus for accomplishing chip separation and pickup in the manner just described is found in U.S. Pat. No. 4,556,362, issued on Dec. 3, 1985, to N. Bahnck et al. and assigned to AT&T Technologies.

Chip separation and chip pickup, as presently practiced, require two separate positioning operations. First the diaphragm must be positioned over the die ejector and then the pickup device must be positioned over the separated chip. Each positioning must be carried out precisely, thus necessitating an accurate positioning system (e.g., a servo motor and associated electronics) which is usually expensive.

Thus there is need for a technique which reduces the number of positioning operations required to accomplish chip separation and chip pickup.

SUMMARY OF THE INVENTION

Briefly, in accordance with a first aspect of the invention, a method is provided for separating an individual member (i.e., a chip) from an array of such members adhered to the upper surface of a diaphragm to facilitate pickup of the member by a pickup tool carried by a robot. The method is initiated by engaging the free end of an elongated "C"-shaped arm with a robot which carries a pickup tool such that upon engagement, the pickup tool overlies a die ejector at the free end of the lower portion of the arm. Thereafter the robot is displaced to move the arm to position the die ejector beneath, and the pickup tool above, a selected one of the members in the array on the diaphragm. The die ejector is then operated to force the chip upwardly off the diaphragm and towards the pickup tool for pickup thereby.

In accordance with another aspect of the invention, an apparatus is provided for separating an individual member (i.e., a chip) within an array of such members adhered to the upper surface of a diaphragm to facilitate pickup of the member by a pickup tool carried by a robot. The apparatus comprises an elongated "C"-shaped arm having engagement means at the free end of its upper portion and a die ejector at the free end of its lower portion. The engagement means on the upper arm portion is adapted for engagement by a robot which carries a pickup tool such that upon engagement of the upper arm portion by the robot, the pickup tool overlies the die ejector. When the robot has positioned the arm such that the die ejector lies beneath a chip on the diaphragm (and the pickup tool lies thereabove), the die ejector can be operated to force the chip upwardly off the diaphragm towards the pickup tool for pickup thereby.

DETAILED DESCRIPTION

Figure 1:
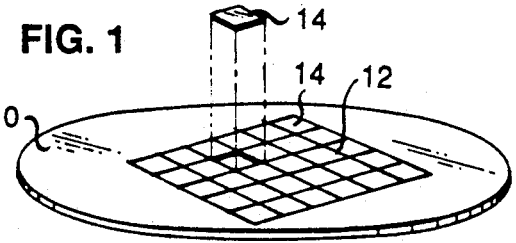
FIG. 1 is a perspective view of a prior art semiconductor wafer showing an individual chip separated therefrom.

FIG. 1 shows a conventional semiconductor wafer 10 from which integrated circuits are manufactured by processing the wafer to form a plurality of electronic circuits (not shown) thereon. Following formation of the circuits, the wafer 10 is then diced by cutting kerf lines 12 therein to obtain a plurality of chips 14, each containing one or more of the circuits. The individual chips 14, when packaged, form an integrated circuit (not shown).

Figure 2:
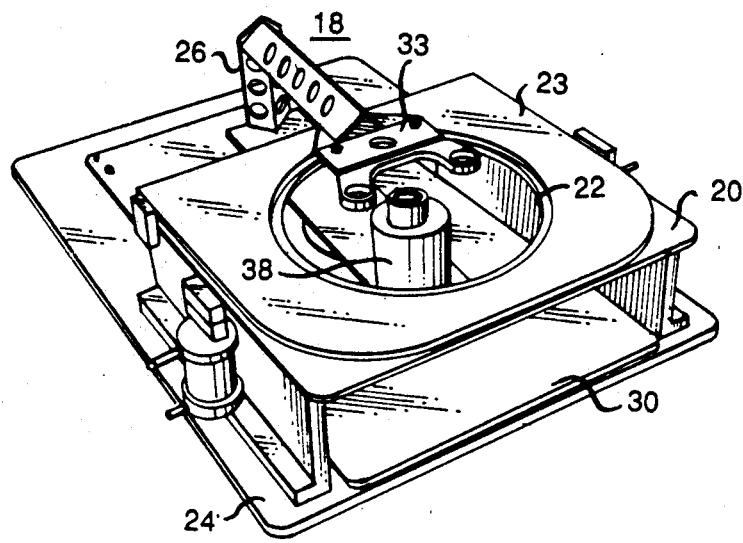
FIG. 2 is a perspective view of a portion of an apparatus, in accordance with the invention, for separating individual chips from the wafer of FIG. 1.
Figure 4:
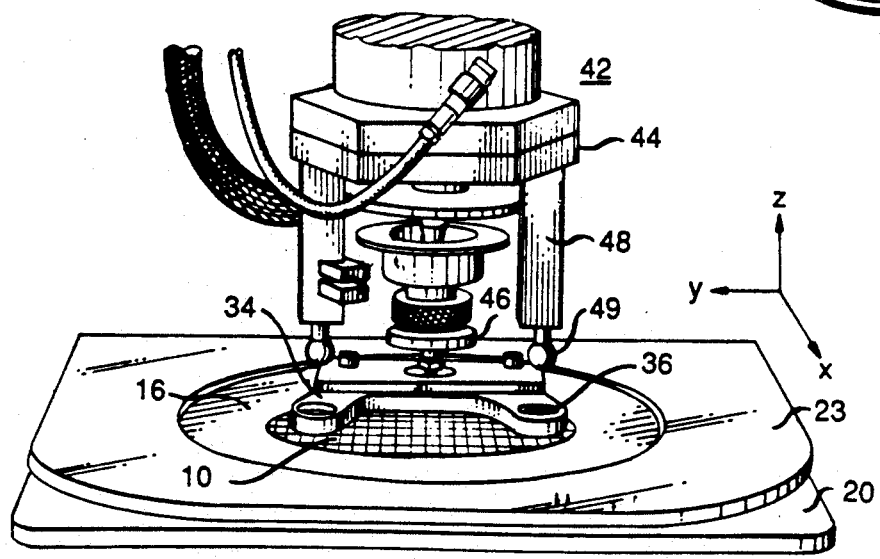
FIG. 4 is a front view of the chip-separating apparatus of FIGS. 2 and 3 in conjunction with a robot which carries a pickup tool.

Referring now to FIG. 2, separation of individual chips 14 (see FIG. 1) from the wafer 10 of FIG. 1 is facilitated by adhering the wafer to a film diaphragm 16 (see FIG. 4) and then cutting the wafer to yield the kerf lines 12 (see FIG. 1). The depth of the cut is controlled so that the kerf lines 12 of FIG. 1 extend through the wafer 10 but not through the diaphragm 16. In this way, the circuits remain arrayed to facilitate their testing. Yet by applying an upward force to the undersurface of the diaphragm 16, a chip 14 can be separated from the wafer. Referring to FIG. 2, separation of the chip 14 of FIG. 1 from the wafer 10 of FIG. 1 is accomplished by an apparatus 18, in accordance with the invention, once the diaphragm 16 of FIG. 4 is placed on a table 20 so that the wafer 10 is exposed though an opening 22 in the table. Associated with the table 20 is a clamp 23 which holds the diaphragm 16 to the table. The table 20, which is supported in spaced relationship above a work surface 24, and the clamp 23 associated with the table, do not comprise part of the apparatus 18, but rather serve only to support the diaphragm 16 of FIG. 4 so its upper and lower surfaces are exposed.

Figure 3:
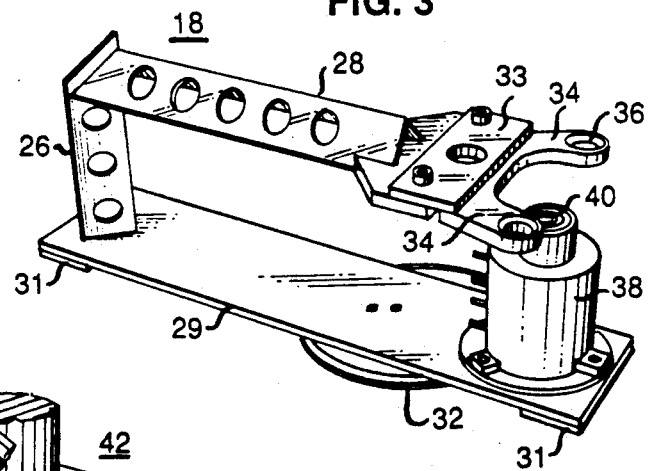
FIG. 3 is a perspective of the chip-separating apparatus of FIG. 2.

As best seen in FIG. 3, the apparatus 18 comprises a generally "C"-shaped arm 26 which has parallel horizontal upper arm and lower arm portions 28 and 29. The upper and lower arm portions 28 and 29 are spaced sufficiently far apart and are sufficiently elongated to enable the free end of the upper arm portion to overlie the diaphragm 16 (see FIG. 4), when it is seated on the table 20, while the lower arm portion rests on a plate 30 on the work surface 24 of FIG. 2 below the opening 22 (see FIG. 2) in the table. A pair of anti-friction glides 31 is mounted to the undersurface of the lower arm portion 29 to facilitate movement of the lower arm portion across a plate 30 (see FIG. 2) on the surface 24 of FIG. 2 with little drag. A vacuum hold down locking device 32 is also mounted to the undersurface of the lower arm portion 29 to lock the arm 26 in place on the plate 30 once the apparatus is positioned in the manner discussed hereinafter.

Referring to FIG. 3, mounted to the free end of the upper arm portion 28 is a yoke 33 having a pair of outwardly extending, spaced-apart yoke fingers 34, each finger having a passage 36 extending vertically therethrough. The lower arm portion 29 of the arm 26 carries a die ejector 38 at its free end such that the die ejector is centrally located between the yoke fingers 34. The die ejector 38 generally takes the form of an air cylinder which vertically reciprocates a pin 40. The pin 40, when driven upwardly by the die ejector 38 against the undersurface of the diaphragm 16 of FIG. 4, will separate an individual chip 14 of FIG. 1 from the wafer 10 of FIG. 1.

Referring to FIG. 4, the apparatus 18 is manipulated by a robot 42, which in a preferred embodiment, comprises an FWS model 200 flexible work station made by AT&T. This particular robot 42 is generally characterized as a "gantry-type" robot and moves in both an x and y direction along the undersurface of a platen (not shown) overlying the table 20. The robot 42 carries an end effector 44 which is displaced along a Z axis by means of a motor-driven lead screw (not shown). Depending from the end effector 44 is a pickup tool 46 of the vacuum variety for engaging a chip 14 (see FIG. 1) separated from the wafer 10 by the die ejector 38 of FIGS. 2 and 3.

Each of a pair of spaced-apart posts 48 extends downwardly from the end effector 44 such that the pickup tool 46 is centered between the posts. The posts 48 are spaced apart the same distance as the passages 36 in the yoke fingers 34 of FIG. 3. At the lower tip of each post 48 is a depending, ball-shaped projection 49 dimensioned for receipt in a separate one of the yoke finger passages 36 of FIG. 3. When the projections 49 seat in the yoke finger passages 36, the center of the pickup tool 46 is aligned directly above the pin 40 (see FIG. 3) of the die ejector 38 of FIG. 3.

To separate a chip 14 (see FIG. 1) from the wafer 10 of FIG. 1 with the apparatus 18 of the invention, the robot 42 is operated so that the end effector 44 engages the yoke 34 by seating the projections 49 in the yoke finger passages 36. Thereafter, the end effector 44 is displaced to position the die ejector 38 beneath, and the pickup tool 46 above, the chip 14 of FIG. 1 to be separated. Next, the die ejector 38 of FIG. 3 is operated to drive its pin 40 of FIG. 3 upwardly to contact the undersurface of the diaphragm 16 of FIG. 4 to separate the overlying chip 14 of FIG. 1, forcing the chip towards the pickup tool 46 which then engages it. Once the chip 14 of FIG. 1 is engaged by the pickup tool 46, the end effector 44 is displaced upwardly so that the projections 49 disengage the yoke finger passages 36, allowing the chip to be moved away from the diaphragm 16 and placed as required. After the chip 14 of FIG. 1 has been placed, the end effector 44 of FIG. 4 is positioned to reengage the yoke 32 of FIG. 3. The end effector 44 is then displaced to locate the die ejector 38 (see FIG. 3) below and the pickup tool 46 above, respectively, the next chip 14 of FIG. 1 to be separated. This process is repeated until all of the chips 14 of FIG. 1 have been separated.

A distinct advantage of carrying chip separation with the use of the apparatus 18 in the manner described above is that the die ejector 38 and the pickup tool 46 are positioned simultaneously by the robot 42. Thus, only a single positioning operation is required, in contrast to the prior art approach of first positioning the diaphragm 16 above the die ejector 38, and then positioning the pickup tool 46 above the separated chip 14.

While the apparatus 18 has been described in connection with a gantry-type robot 42, it should be understood that any type of robot may be employed instead. For example, an articulated arm robot, as is well known in the art, could easily be employed.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method of handling a selected article within an array of articles adhered to the upper surfaces of a diaphram comprising the steps of:
    supporting the diaphram on a first supporting surface with an opening therein;
    securing said diaphram to overlie said opening;
    supporting said first supporting surface in a vertically spaced relationship to a second supporting surface;
    engaging and supporting a die ejector apparatus on said second surface;
    engaging a portion of said die ejector with an engaging means mounted on a pick-up tool;
    simultaneously displacing said pick-up tool and die ejector substantially as a single unit to a position wherein said pick-up tool and die ejector are aligned with a selected article on said diaphram wherein selected article is located between said pick-up tool and die ejector;
    engaging a surface of the diaphram with a moveable member of the die ejector to separate the selected article from said diaphram and to move said selected article toward said pick-up tool;
    engaging said selected article with said pick-up tool;
    disengaging said engaging means from said die ejector; and
    moving said selected article to a desired location.

2. The method according to claim 1 wherein:
    said engaging means on said pick-up tool engages said portion of said die ejector apparatus by seating in at least one socket in said portion.

3. The method according to claim 1 wherein:
    said selected article is engaged by the pick-up tool by causing said pick-up tool to apply a vacuum to said article.

4. The method according to claim 1 wherein:
    the surface of the diaphram is engaged by said movable member by driving said member directly against said diaphram to push said article therefrom.

* * * * *